US012635344B2

(12) United States Patent (10) Patent No.: US 12,635,344 B2
Chai (45) Date of Patent: May 19, 2026

(54) DISPLAY MODULE INCLUDING ARRAY LAYERS AND LIGHT-EMITTING DEVICES AND DISPLAY DEVICE HAVING THE SAME

(71) Applicants:Wuhan Tianma Micro-Electronics Co., Ltd., Wuhan (CN); Wuhan Tianma Micro-Electronics Co., Ltd. Shanghai Branch, Shanghai (CN)

(72) Inventor: Huiping Chai, Wuhan (CN)

(73) Assignees: Wuhan Tianma Micro-Electronics Co., Ltd., Wuhan (CN); Wuhan Tianma Micro-Electronics Co., Ltd. Shanghai Branch, Shanghai (CN)

( * ) Notice: Subject to any disclaimer, the term of this patent is extended or adjusted under 35 U.S.C. 154(b) by 385 days.

(21) Appl. No.: 18/227,046

(22) Filed: Jul. 27, 2023

(65) Prior Publication Data

US 2024/0365592 A1 Oct. 31, 2024

(30) Foreign Application Priority Data

Apr. 27, 2023 (CN) .......................... 202310499500.3

(51) Int. Cl.
*H01L 29/08* (2006.01)
*H10K 59/121* (2023.01)
(52) U.S. Cl.
CPC ................................ *H10K 59/1216* (2023.02)

(58) Field of Classification Search
CPC .................................................. H10K 59/1216
USPC ........................................................ 257/40
See application file for complete search history.

(56) References Cited

U.S. PATENT DOCUMENTS

2016/0216574 A1* 7/2016 Shin .................. G02F 1/134309
2018/0053788 A1* 2/2018 Lee ......................... H10D 86/60
2022/0320217 A1* 10/2022 Han ......................... H10K 59/60

FOREIGN PATENT DOCUMENTS

WO WO-2023015622 A1 * 2/2023 ......... H10K 59/1213

* cited by examiner

*Primary Examiner* — Phuc T Dang
(74) *Attorney, Agent, or Firm* — Anova Law Group, PLLC

(57) ABSTRACT

A display module and a display device are provided. The display module includes array layers and light-emitting devices. One light-emitting device is located on a side of one corresponding array layer facing a light-emitting surface of the display module, and includes a source-drain metal layer which includes a first metal component and a second metal component. The light-emitting device includes an anode layer which includes a first-type anode unit disposed correspondingly to the first metal component and a second-type anode unit disposed correspondingly to the second metal component. The second-type anode unit includes a first body portion and a first sub-extension unit connected to each other. Along a thickness direction of the display module, the first metal component at least partially overlaps the first-type anode unit, and the second metal component at least partially overlaps the first sub-extension unit while does not overlap the first body portion.

16 Claims, 12 Drawing Sheets

612

100

G1

200

100

DISPLAY MODULE INCLUDING ARRAY LAYERS AND LIGHT-EMITTING DEVICES AND DISPLAY DEVICE HAVING THE SAME

CROSS-REFERENCE TO RELATED APPLICATION

This application claims the priority of Chinese Patent Application No. 202310499500.3, filed on Apr. 27, 2023, the content of which is incorporated herein by reference in its entirety.

TECHNICAL FIELD

The present disclosure generally relates to the field of display technology and, more particularly, relates to a display module and a display device.

BACKGROUND

In an organic electroluminescence display product, a low temperature poly-silicon array (LTPS) circuit design is disposed at a lower side of an OLED light-emitting area. A vertical projection of an anode corresponding to an OLED light-emitting sub-pixel and its array layer circuit has an overlapping area. Specifically, the anode corresponding to the OLED light-emitting sub-pixel have overlapping areas with a signal line in the array circuit, such that parasitic capacitance may be generated during the operation of the display module. When the covering area of the orthographic projections of anodes in odd columns and first nodes (wirings of a first metal layer and wirings of a second metal layer) in the array circuit is different from the covering area of the orthographic projections of anodes in even columns and first nodes, the capacitance of the fourth nodes and the first nodes of the odd columns and the even columns vary greatly, resulting in uneven display and uneven vertical stripes.

SUMMARY

One aspect of the present disclosure provides a display module. The display module includes: array layers and light-emitting devices. One light-emitting device is located on a side of one corresponding array layer facing a light-emitting surface of the display module, and includes a source-drain metal layer which includes a first metal component and a second metal component. The light-emitting device includes an anode layer which includes a first-type anode unit and a second-type anode unit. The first-type anode unit is disposed correspondingly to the first metal component, and the second-type anode unit is disposed correspondingly to the second metal component. The second-type anode unit includes a first body portion and a first sub-extension unit connected to each other. Along a thickness direction of the display module, the first metal component at least partially overlaps the first-type anode unit, and the second metal component at least partially overlaps the first sub-extension unit while does not overlap the first body portion.

Another aspect of the present disclosure provides a display device. The display device includes a display module. The display module includes: array layers and light-emitting devices. One light-emitting device is located on a side of one corresponding array layer facing a light-emitting surface of the display module, and includes a source-drain metal layer which includes a first metal component and a second metal component. The light-emitting device includes an anode layer which includes a first-type anode unit and a second-type anode unit. The first-type anode unit is disposed correspondingly to the first metal component, and the second-type anode unit is disposed correspondingly to the second metal component. The second-type anode unit includes a first body portion and a first sub-extension unit connected to each other. Along a thickness direction of the display module, the first metal component at least partially overlaps the first-type anode unit, and the second metal component at least partially overlaps the first sub-extension unit while does not overlap the first body portion.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
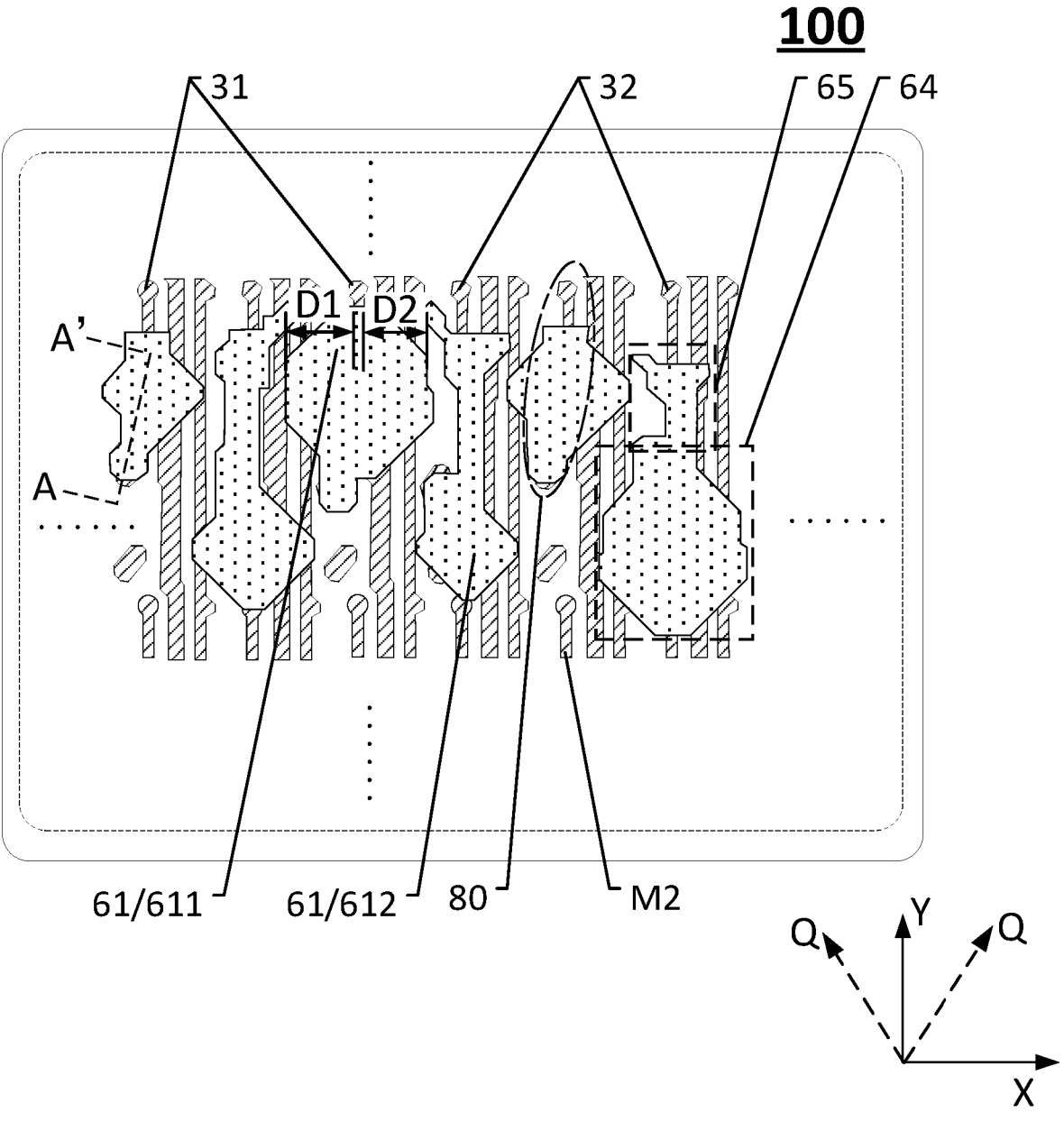
FIG. 1 illustrates an exemplary display module consistent with various disclosed embodiments of the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like portions, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be exaggerated. Besides, those schematic diagrams are merely examples, and not intended to limit the scope of the disclosure. Furthermore, a three-dimensional (3D) size including length, width, and depth should be considered during practical fabrication.

Figure 2:
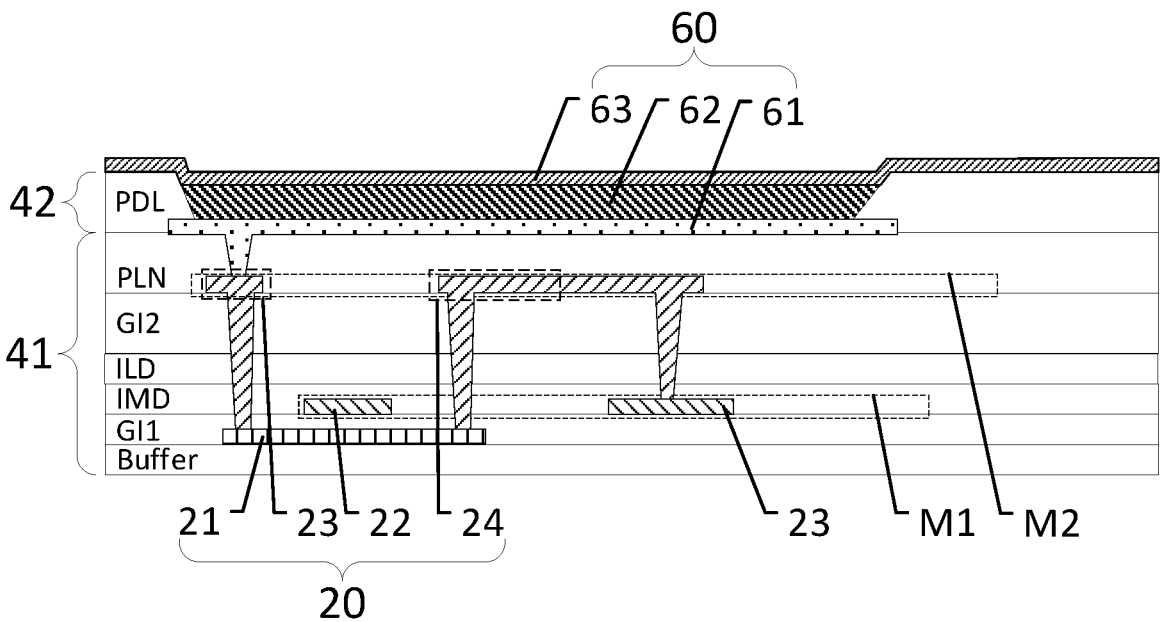
FIG. 2 illustrates a cross-sectional view along an A-A' direction in FIG. 1, consistent with various disclosed embodiments of the present disclosure.
Figure 3:
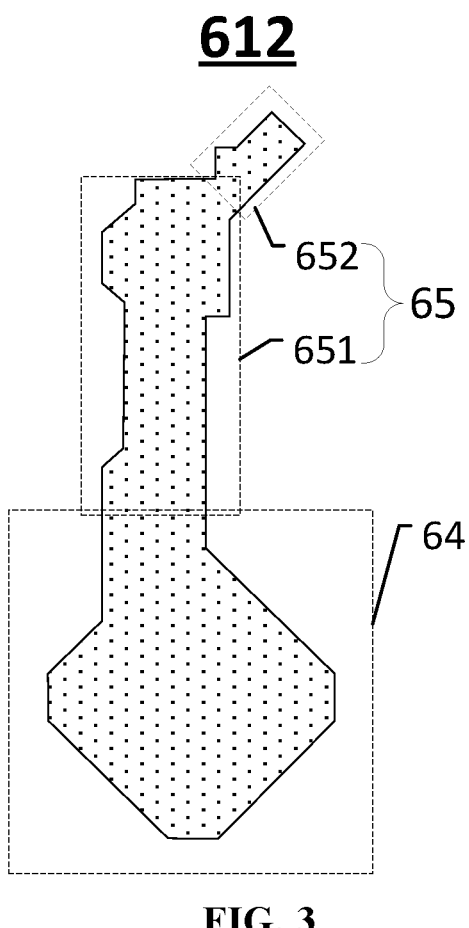
FIG. 3 illustrates an enlarged view of a second-type anode unit in FIG. 1 consistent with various disclosed embodiments of the present disclosure.

The present disclosure provides a display module. As shown in FIG. 1 illustrating an exemplary display module provided by one embodiment of the present disclosure, FIG. 2 illustrating a schematic diagram of AA' in FIG. 1, and FIG. 3 illustrating an enlarged view of a second-type anode unit in FIG. 1, in one embodiment, the display module 100 may include array layers 41 and light-emitting devices 60. One light-emitting device 60 may be located on a side of one corresponding array layer 41 facing a light-emitting surface of the display module 100.

Each array layer 41 may include a source/drain metal layer M2. The source/drain metal layer M2 may include a first metal component 31 and a second metal component 32.

Each light-emitting device 60 may include an anode layer 61, and the anode layer 61 may include a first-type anode unit 611 and a second-type anode unit 612. The first-type anode unit 611 and the first metal component 31 may be arranged correspondingly. The second-type anode unit 612 and the second metal component 32 may be arranged correspondingly.

The second-type anode unit 612 may include a first body portion 64 and a first sub-extension unit 65 connected to each other.

Along a thickness direction of the display module 100, the first metal component 31 and the first-type anode unit 611 may at least partially overlap, and the second metal component 32 may at least partially overlap with the first sub-extending unit 65 and may not overlap with the first body part 64.

In the present embodiment, the display module 100 may include the array layers 41 and the film layers 42 on the side of the array layers 41 facing the light-emitting surface of the display module 100 for arranging the light-emitting devices 60. Each array layer 41 may be used to provide electrical signals for one corresponding light-emitting device 60 to control the light-emitting device 60 to be in the on state or the off state, to realize the adjustment and control of the required display state of the light-emitting device 60. A pixel driving circuit electrically connected to the light-emitting device 60 may be disposed in the array layer 41. The pixel driving circuit may include a transistor 20 electrically connected to the light-emitting device 60. The transistor 20 may at least include a gate 22, a source 23/24, a drain 24/23, and an active layer 21. The source 23/24 and the drain 24/23 may be disposed on a same wiring layer, and the gate 22 may be disposed on the side of the wiring layer where the source 23/24 is located away from the light-emitting surface of the display module 100. The source 23/24 or the drain 24/23 of the transistor 20 may be electrically connected to the light-emitting device 60, to realize the transmission of electrical signals to the light emitting device 60.

A film layer structure of one array layer 41 may at least include the gate electrode layer M1 and the source/drain metal layer M2. The gate electrode layer M1 may be used to accommodate the gate 22 of the transistor 20 and other required gate electrodes 23, and the source-drain metal layer M2 may be used to accommodate at least one of the sources 23/24 or the drain 24/23 of the transistor 20. As mentioned above, the source-drain metal layer M2 may be optionally disposed on the side of the gate electrode layer M1 facing the light-emitting surface of the display module 100, and one of the sources 23/24 or the drain 24/23 of the transistor 20 may be directly electrically connected with the light-emitting device 60. To clearly illustrate the embodiments provided by the present disclosure, the embodiment where another one of the sources 23/24 or the drain 24/23 of the transistor 20 located in an odd-numbered column or an even-numbered column is respectively defined as a first metal component 31 and a second metal component 32; is used as an example. For example, one of the source 23/24 or the drain 24/23 of the transistor 20 located in an odd-numbered column that is not directly electrically connected to the light emitting device 60 may be used as the first metal component 31, and one of the source 23/24 or drain 24/23 of the transistor 20 in the even-numbered column that is not directly electrically connected to the light emitting component 60 may be used as the second metal component 32. It should be noted that the first metal component 31 and the second metal component 32 here may be selected to be completely the same in structure, and they are only named differently for the purpose of clearly illustrating the embodiments provided by the present disclosure. For example, the first metal component 31 and the second metal component 32 may both be the source 23/24 or the drain 24/23 of the transistor 20.

The light-emitting device 60 may include the anode layer 61, the light-emitting layer 62, and the cathode layer 63 stacked along the thickness direction of the display module 100. The light-emitting layer 62 may be sandwiched between the anode layer 61 and the cathode layer 63, and the cathode layer 63 may be disposed on the side of the light-emitting layer 62 facing the light-emitting surface of the display module 100. The transistor 20 may be electrically connected to the anode layer 61 in the light-emitting device 60. Each light-emitting device 60 may be able to emit light independently. Therefore, each light-emitting device 60 may be provided with one anode unit in the anode layer 61. Since each light-emitting device 60 may be correspondingly provided with one electrically connected transistor 20, one anode unit electrically connected to the transistor 20 corresponding to the first metal component 31 may be selected as a first-type anode unit 611, and one anode unit electrically connected to the transistor 20 corresponding to the second metal component 32 may be selected as a second-type anode unit 612.

In one embodiment, the structures of the first-type anode unit 611 and the second-type anode unit 612 may be different. Specifically, the first-type anode unit 611 located in odd columns may only include a body portion, and the second-type anode units 612 located in even columns may include a first body portion 64 and a first sub-extension unit 65 connected to each other. Along the thickness direction of the display module 100, the first metal component 31 may be configured to at least partially overlap with the first-type anode unit 611 arranged correspondingly provided and only including the body portion, and the second metal component 32 may be arranged to at least partially overlap with the first sub-extension unit 65 in the correspondingly arranged second-type anode unit 612 and not overlap with the first body portion 64. Therefore, in the direction perpendicular to the thickness direction of the display module 100, the first-type anode unit 611 and the first metal component 31 in the corresponding transistor 20 electrically connected may at least have a partially overlapping area, and the first sub-extension unit 65 of the second-type anode unit 612 and the second metal component 32 in the corresponding transistor 20 electrically connected may at least have a partially overlapping area, such that both the first-type anode unit 611 and the second-type anode unit 612 may have same overlapping area of orthographic projections respectively with the corresponding first metal component 31 and the second metal component 32 in the source-drain metal layer M2. Correspondingly, the anode unit of the odd-numbered and the anode unit of even-numbered columns may have same overlapping area of orthographic projections respectively with the first node in the array circuit (such as the first metal component 31 and the second metal component 32). There may be no (large) difference between the capacitance of the fourth node and the first node of the odd-numbered column and the even-numbered column, to avoid inhomogeneous display of the display module 100 caused by the capacitance difference between the anode units of the odd-numbered column and the even-numbered column and the first node. Therefore, the uneven vertical stripes may be avoided and the display effect of the display module 100 may be improved.

In the array layer 41 of the display module 100, the pixel drive circuits may be arranged in an array, and the arrangement of the source 23/24 and the drain 24/23 of the transistor 20 electrically connected to the anode layer 61 in the array layer 41 may be also relatively regular. In existing technologies, an optional arrangement of the light-emitting devices 60 is a diamond arrangement. At this time, among the three columns of sub-pixels arranged adjacently along the row direction, for example, the odd-numbered columns (the first column and the third column) are red sub-pixels or blue sub-pixels, and the even-numbered column (the second column) are green sub-pixels. The body portions of each row of the first-type anode units 611 corresponding to the red sub-pixels and blue sub-pixels in odd-numbered columns may be arranged in a row, and the first body portions 64 of the second-type anode units 612 corresponding to the green pixels in the even column may be arranged in another row. That is, in a same group of red sub-pixels, blue sub-pixels and the green sub-pixels, the first-type anode units 611 corresponding to the red sub-pixels and the blue sub-pixels may be arranged in the same row, and the first body portion 64 in the second-type anode units 612 corresponding to the green sub-pixels may be located in another row. The first body portion 64 in the second-type anode units 612 corresponding to the green sub-pixel and the-first type anode units 611 corresponding to the red sub-pixel and the blue sub-pixel may be disposed in different rows. To ensure that the first-type anode units 611 and the second-type anode units 612 have overlapping areas with the corresponding first metal components 31 and the corresponding second metal components 32 in the corresponding electrically connected transistors 20, in the present disclosure, each second-type anode unit 612 may be configured to include one first body portion 64 and one first sub-extension unit 65. By setting the first sub-extending unit 65 to have a part disposed in a same row with the first-type anode unit 611, the first sub-extension unit 65 of the second-type anode unit 612 may have an overlapping area with the second metal component 32 in the transistor 20 in the thickness direction of the display module 100. Therefore, both the first-type anode unit 611 and the second-type anode unit 612 may have same overlapping area of orthographic projections respectively with the corresponding first metal component 31 and the second metal component 32 in the source-drain metal layer M2. Correspondingly, the anode unit of the odd-numbered and the anode unit of even-numbered columns may have same overlapping area of orthographic projections respectively with the first node in the array circuit (such as the first metal component 31 and the second metal component 32). There may be no (large) difference between the capacitance of the fourth node and the first node of the odd-numbered column and the even-numbered column, to avoid inhomogeneous display of the display module 100 caused by the capacitance difference between the anode unit of the odd-numbered column and the even-numbered column and the first node. Therefore, the uneven vertical stripes may be avoided and the display effect of the display module 100 may be improved.

Figure 4:
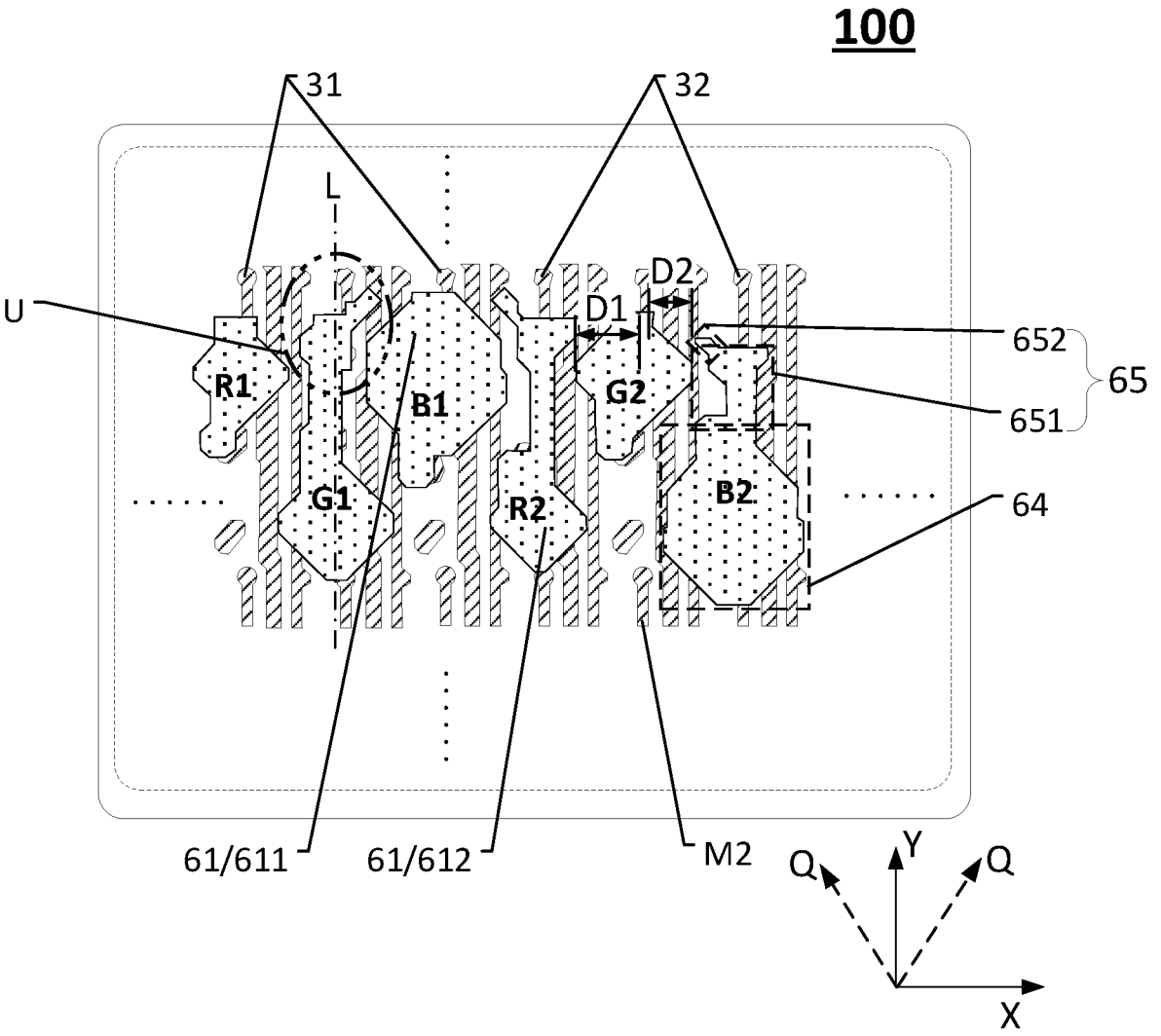
FIG. 4 illustrates a schematic diagram of an anode layer shifted to the left in an exemplary display module, consistent with various disclosed embodiments of the present disclosure.
Figure 5:
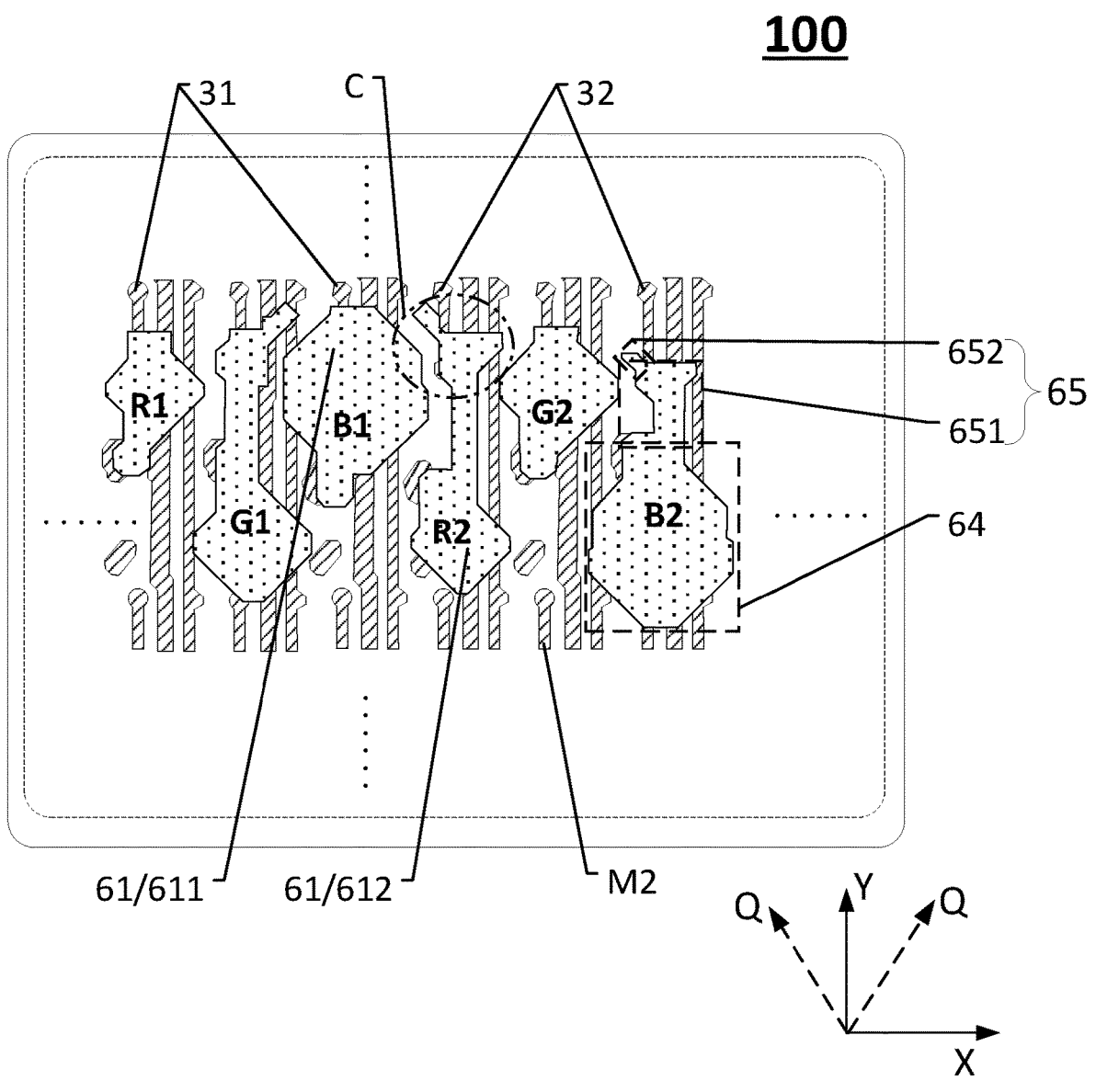
FIG. 5 illustrates a schematic diagram of an anode layer shifted to the right in an exemplary display module, consistent with various disclosed embodiments of the present disclosure.

In some embodiments shown in FIGS. 1-3, FIG. 4 which is a schematic diagram of an anode layer shifted to the left in an exemplary display module, and FIG. 5 illustrating a schematic diagram of an anode layer shifted to the right in an exemplary display module, one first sub-extension unit 65 may include a first extension portion 651 and a second extension portion 652 connected to each other, and the second extension portion 652 may be located at a side of the first extension portion 651 away from the first body portion 64.

In the present embodiment, one first sub-extension unit 65 may include a first extension portion 651 and a second extension portion 652 connected to each other. An area of an orthographic projection of the second extension portion 652 to the light-emitting surface of the display module 100 may be smaller than an area of an orthographic projection of the first extension portion 651 to the light-emitting surface of the display module 100, and the second extension portion 652 may be located at a side of the first extension portion 651 away from the first body portion 64. In the thickness direction of the display module 100, under the condition that the anode layer 61 and the array layer 41 are not deviated, that is, when the anode layer 61 and the array layer 41 are completely the same as the design, the first extension portion 651 of the first sub-extension unit 65 may have at least a partial overlapping area with the second metal member 32 in the thickness direction of the display module 100, such that both the first-type anode unit 611 and the second-type anode unit 612 may have same overlapping area of orthographic projections respectively with the corresponding first metal component 31 and the second metal component 32 in the source-drain metal layer M2. Correspondingly, the anode unit of the odd-numbered and the anode unit of even-numbered columns may have same overlapping area of orthographic projections respectively with the first node in the array circuit (such as the first metal component 31 and the second metal component 32). There may be no (large) difference between the capacitance of the fourth node and the first node of the odd-numbered column and the even-numbered column, to avoid inhomogeneous display of the display module 100 caused by the capacitance difference between the anode unit of the odd-numbered column and the even-numbered column and the first node. Therefore, the uneven vertical stripes may be avoided and the display effect of the display module 100 may be improved.

During the fabrication of the array layer 41 and the anode layer 61, it is inevitable that the position of the anode unit in the anode layer 61 is shifted to the left or right in the row direction compared with the original design. For example, in FIG. 4 compared with FIG. 1, the anode layer 61 is shifted to the left. For another example, in FIG. 5 compared with FIG. 1, the anode layer 61 is shifted to the right. At this time, when the second-type anode unit 612 only include the first body portion 64 and the first extension portion 651, the area of the orthographic projection of the first extension portion 651 and the second metal component 32 may become smaller than the area required by the original design due to the position shift of the first extension portion 651 and it may be impossible to ensure that the capacitance between the second-type anode unit 612 and the second metal component 32 and the capacitance between the first-type anode unit 611 and the first metal component 31 are consistent, inducing the problem of uneven display in the display process of the display module 100. In the present embodiment, the second-type anode unit 612 may be configured to further include the second extension portion 652 connected with the first extension portion 651. When the actual manufacturing position of the second-type anode unit 612 is shifted to the left or right in the row direction compared with the original design, the decreased portion of the overlapping area between the orthographic projection of the first extension portion 651 and the second metal component 32 in the thickness direction of the display module 100 may be compensated by the overlapping area between the orthographic projection of the second extension portion 652 and the second metal component 32. In the U region in FIG. 4, the second extension portion 652 and the second metal component 32 may have a partially overlapping area. In the C region in FIG. 5, the second extension portion 652 and the second metal component 32 may have a partially overlapping area. Therefore, both the first-type anode unit 611 and the second-type anode unit 612 may have same overlapping area of orthographic projections respectively with the corresponding first metal component 31 and the second metal component 32 in the source-drain metal layer M2. Correspondingly, the anode unit of the odd-numbered and the anode unit of even-numbered columns may have same overlapping area of orthographic projections respectively with the first node in the array circuit (such as the first metal component 31 and the second metal component 32). There may be no (large) difference between the capacitance of the fourth node and the first node of the odd-numbered column and the even-numbered column, to avoid inhomogeneous display of the display module 100 caused by the capacitance difference between the anode unit of the odd-numbered column and the even-numbered column and the first node. Therefore, the uneven vertical stripes may be avoided and the display effect of the display module 100 may be improved.

Further, when the position of the anode unit in the anode layer 61 is shifted to the left or right in the row direction compared with the original design, the area of the ortho-graphic projection of the first extension portion 651 and the second metal component 32 may become smaller than the area required by the original design, and the difference between the capacitance of the fourth node and the first node of the odd-numbered column and the even-numbered column may increase correspondingly. The parallel plate capacitance between the second extension portion 652 and the second metal component 32, and the lateral capacitance formed between the second extension portion 652 and the side surface of the second metal component 32 may both compensate the parallel plate capacitance between the first extension portion 651 and the second metal component 32 reduced by positional offset. Therefore, both the first-type anode unit 611 and the second-type anode unit 612 may maintain a same or close capacitance respectively with the corresponding first metal component 31 and the second metal component 32 in the source-drain metal layer M2, to avoid inhomogeneous display of the display module 100 caused by the capacitance difference between the anode unit of the odd-numbered column and the even-numbered col-umn and the first node. Therefore, the uneven vertical stripes may be avoided and the display effect of the display module 100 may be improved.

Figure 6:
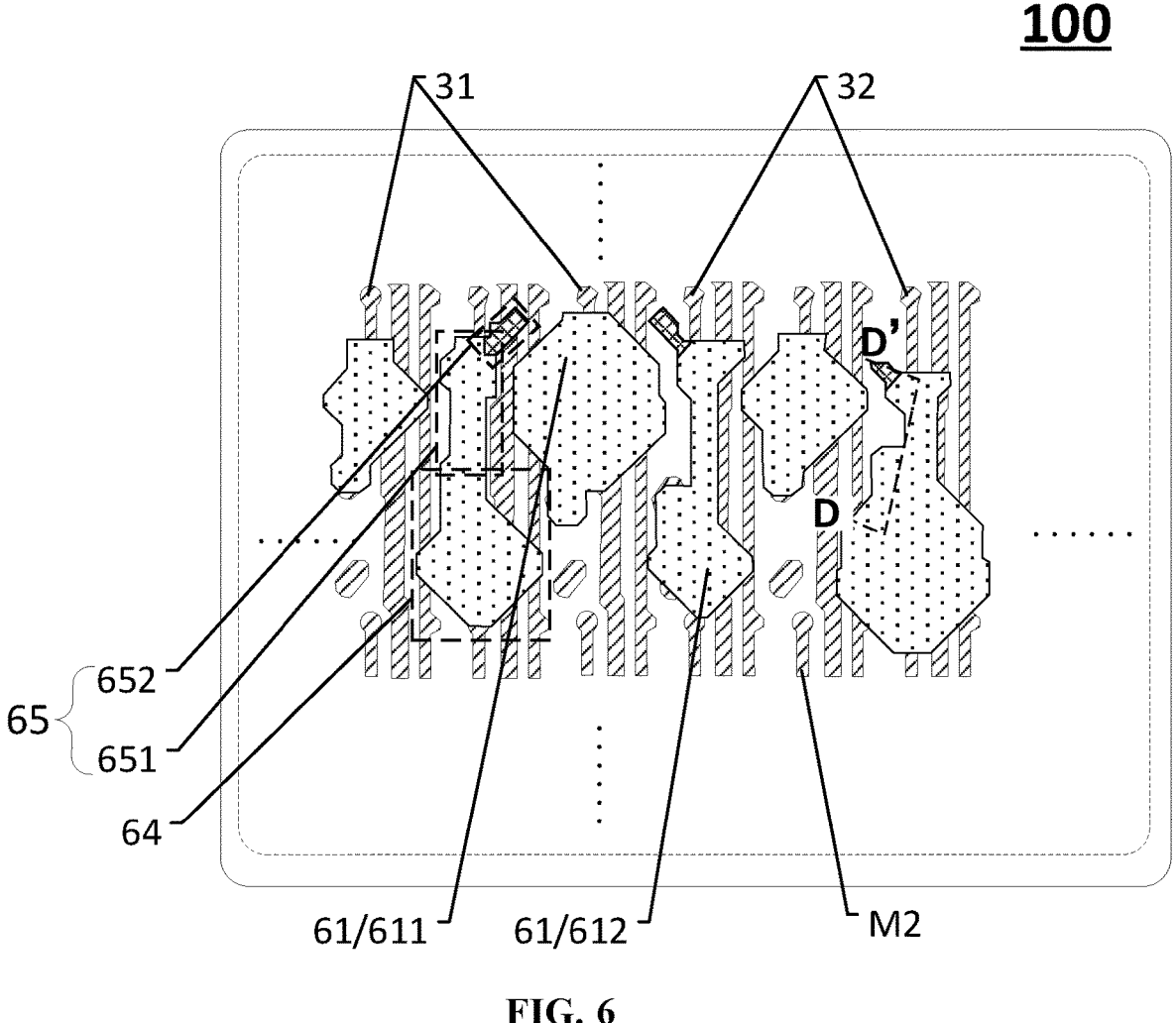
FIG. 6 illustrates another exemplary display module consistent with various disclosed embodiments of the present disclosure.
Figure 7:
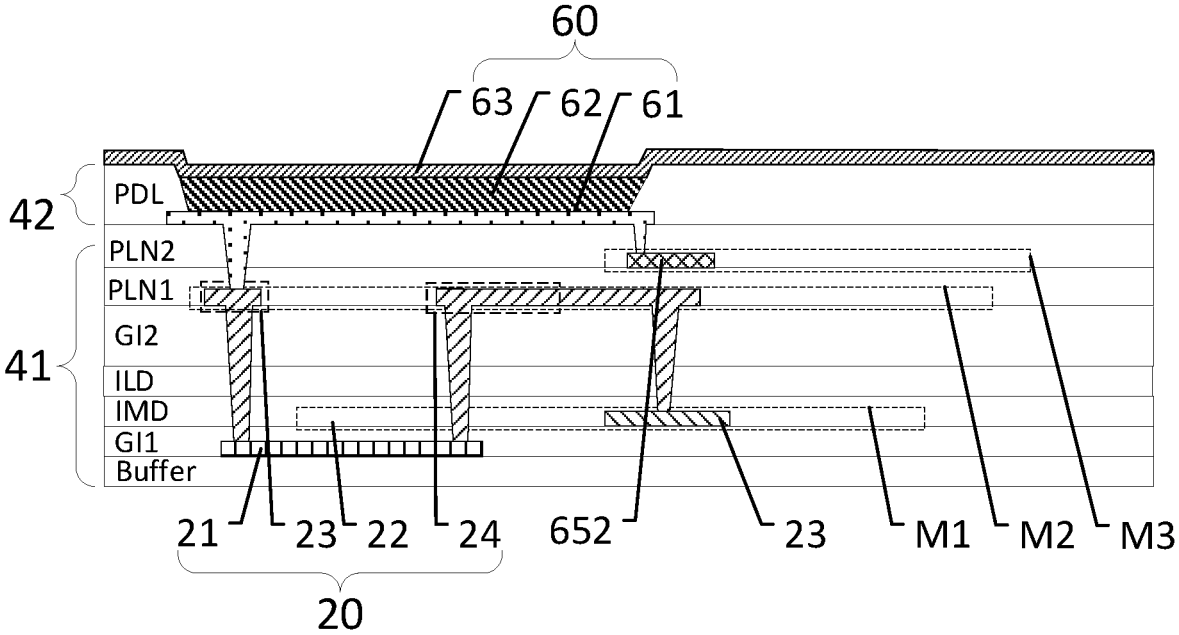
FIG. 7 illustrates a cross-sectional view along a D-D' direction in FIG. 6, consistent with various disclosed embodiments of the present disclosure.

In another embodiment shown in FIG. 1 to FIG. 3, FIG. 6 which illustrates another exemplary display module, and FIG. 7 illustrating a schematic diagram of DD' in FIG. 6, the first extension portion 651 and the first body portion 64 may be disposed in a same layer, and the second extension portion 652 and the first extension portion 651 may be disposed in a same layer or in different layers.

In the present embodiment, the first extension portion 651 and the first body portion 64 in the second-type anode unit 612 may be disposed in the same layer and made of a same material, that is, the first extension portion 651 and the first body portion 64 may be formed in the same process using the same method, to avoid increasing the complexity of the manufacturing process and manufacturing method of the display module 100 and improve the manufacturing effi-ciency of the display module 100.

Further, the second-type anode unit 612 may include the first body portion 64, the first extension portion 651, and the second extension portion 652 connected to the first exten-sion portion 651. As shown in FIG. 1 to FIG. 3, the first body portion 64, the first extension portion 651, and the second extension portion 652 may be made of a same material and disposed in a same layer, to avoid increasing the complexity of the manufacturing process and manufacturing method of the display module 100 and improve the manufacturing efficiency of the display module 100. In one embodiment, as shown in FIG. 6 and FIG. 7, after the first body portion 64 and the first extension portion 651 are made of a same material and disposed in a same layer, when the film layer accommodating the first body portion 64 and the first extension portion 651 has no space enough to accommodate the second extension portion 652, the second extension portion 652 may be formed in another film layer structure as close as possible to the first body portion 64, such as the third metal layer M3 shown in FIG. 7. Further, the electrical connection between the second extension portion 652 and the first extension portion 651 may be realized by punching a hole and connection. Therefore, when the space of devices in the anode layer 61 of the display module 100 is limited, the second extension portion 652 may be formed through the multiplexing of the adjacent film layer structure, solve the problem of uneven display of the display module 100 caused by the offset of the manufacturing position of the anode layer 61 and ensure a good display effect of the display module 100.

For description purposes only, the above embodiment where the electrical connection between the second exten-sion portion 652 and the first extension portion 651 is realized by hole punching and connection when the second extension portion 652 and the first extension portion 651 are disposed in different layers is used as an example to illustrate the present disclosure, and does not limit the scope of the present disclosure. The electrical connection between the second extension portion 652 and the first extension portion 651 may be realized through various suitable ways according to actual needs.

In one embodiment, the array layer 41 in the display module 100 may include a substrate Buffer, a first insulating layer GI1, a dielectric insulating layer IMD, a first interlayer insulating layer ILD, a second insulating layer GI2, a planarization layer PLN, a pixel definition layer PDL, from bottom to top, and the first metal layer M1 and the second metal layer M2 sequentially arranged in the light emitting direction of the display module 100. The first metal layer M1 may be arranged in the dielectric insulating layer IMD, and the second metal layer M2 may be arranged in the planarization layer PLN.

In another embodiment shown in FIG. 7, the array layer 41 in the display module 100 may include a substrate Buffer, a first insulating layer GI1, a dielectric insulating layer IMD, a first interlayer insulating layer ILD, a second insulating layer GI2, a first planarization layer PLN1, a second planarization layer PLN2, a pixel definition layer PDL, from bottom to top. The array layer 41 may also include the first metal layer M1, the second metal layer M2, and a third metal layer M3, sequentially arranged in the light emitting direction of the display module 100. The first metal layer M1 may be arranged in the dielectric insulating layer IMD, the second metal layer M2 may be arranged in the first planarization layer PLN1, and the third metal layer M3 may be arranged in the second planarization layer PLN2.

As shown in FIG. 1 to FIG. 5, in one embodiment, in the thickness direction of the display module 100, at least a portion of the second metal component 32 may at least partially overlap with the first extension portion 651, and the second metal component may not overlap with the second extension portion 652 and may not overlap with the first body portion 64.

In the present embodiment, along the thickness direction of the display module 100, the area where the second metal component 32 and the first extension portion 651 have an overlapping area may at least partially overlap, and the second metal component 32 may not overlap with the second extension portion 652 and may not overlap with the first extension portion 651. As shown in FIG. 1, when the area where the second metal component 32 and the first extension portion 651 have an overlapping area completely overlap, the relative position between the array layer 41 and the anode layer 61 may be configured according to the design requirements, and there may be no offset between the anode layer 61 and the array layer 41 relative to the design scheme. At this time, the areas of the orthographic projections of the first-type anode unit 611 and the corresponding first metal component 31, and the areas of the orthographic projections of the second-type anode unit 612 and the corresponding second metal component 32 may be same, and there may be no uneven display in the display module 100 because of capacitance differences. As shown in FIGS. 4 and 5, when the area where the second metal component 32 should have an overlapping area with the first extension portion 651 only partially overlaps, that is, when there is a positional offset between the anode layer 61 and the array layer 41, along the thickness direction of the display module 100, even when there is no overlapping area between the second extension portion 652 and the second metal component 32, the lateral capacitance formed between the second extension portion 652 and the second metal component 32 may also compensate a part of the parallel plate capacitance that is reduced because of the positional offset between the first extension portion 651 and the second metal component 32. Therefore, both the first-type anode unit 611 and the second-type anode unit 612 may maintain a same or close capacitance respectively with the corresponding first metal component 31 and the second metal component 32 in the source-drain metal layer M2, to avoid inhomogeneous display of the display module 100 caused by the capacitance difference between the anode unit of the odd-numbered column and the even-numbered column and the first node. Therefore, the uneven vertical stripes may be avoided and the display effect of the display module 100 may be improved.

In another embodiment shown in FIG. 1 to FIG. 5, at least a portion of the second metal component 32 may at least partially overlap with the first extension portion 651, and may at least partially overlap with the second extension portion 652, while may not overlap with the first body portion 64.

I the present embodiment, when the area where the second metal component 32 should have an overlapping area with the first extension portion 651 only partially overlaps, that is, when there is a positional offset between the anode layer 61 and the array layer 41, along the thickness direction of the display module 100, even when there is no overlapping area between the second extension portion 652 and the second metal component 32, as shown in the U region in FIG. 4 and the C region in FIG. 5, the second extension portion 652 may be configured to have a certain overlapping area with the second metal component 32, such that the parallel plate capacitance and the lateral capacitance formed between the second extension portion 652 and the second metal component 32 may also compensate a part of the parallel plate capacitance that is reduced because of the positional offset between the first extension portion 651 and the second metal component 32. Therefore, both the first-type anode unit 611 and the second-type anode unit 612 may maintain a same or close capacitance respectively with the corresponding first metal component 31 and the second metal component 32 in the source-drain metal layer M2, to avoid inhomogeneous display of the display module 100 caused by the capacitance difference between the anode unit of the odd-numbered column and the even-numbered column and the first node. Therefore, the uneven vertical stripes may be avoided and the display effect of the display module 100 may be improved.

As shown in FIG. 1 to FIG. 5, in one embodiment, the first extension portion 651 may extend along a first direction Y, and the second extension portion 652 may extend along a second direction Q, where the first direction Y and the second direction Q may intersect.

In the present embodiment, since the distance between the first extension portion 651 and the first-type anode units 611 adjacently arranged in the row direction is relatively small, there may not have enough space to set the second extension portion 652. The extension direction of the first extension portion 651 may be configured to extend along the column direction (the first direction Y), and the extension direction of the second extension portion 652 may be configured to be along the second direction Q intersecting the first direction Y. A minimum angle between the second direction Q and the first direction Y may be less than 90°, or even less than 60°. As shown in FIG. 4 and FIG. 5, the second direction Q which is different from the row direction and different from the column direction to set the second extension component 652, to prevent the arrangement of the second extension component 652 from interfering the adjacent first-type anode units 611 and accommodate the second extension component 652. The reasonable setting of the extension direction of the second extension component 652 may compensate the capacitance between the second-type anode unit 612 and the second metal component 32, to alleviate the problem of uneven display caused by the capacitance difference because of the position shift of the second extension component 652 in the display module 100 and improve the display effect of the display module 100.

Of course, in some embodiments, when there is enough space between the first extension portion 651 and the adjacent first-type anode units 611 in the row direction to arrange the second extension portion 652, the extension direction of the second extension portion 652 may be configured to be perpendicular to the first direction Y. That is, the present disclosure does not specifically limit the extension direction (the second direction Q) of the second extension portion 652, and the extension direction of the second extension portion 652 disposed in the display module 100 may be adjusted according to the actual panel conditions. to achieve the desired technical effect.

As shown in FIG. 1 to FIG. 5, and FIG. 8 illustrating an exemplary second-type anode unit G1, in one embodiment, in the thickness direction of the display module 100, a dummy line L extending along the first direction Y may overlap with the center point of the first body portion 64, and the first extending portion 651 may include a first sub-section 67 and a second sub-section 68 connected along the third direction X. The first sub-section 67 and the second sub-section 68 may be located on two sides of the dummy line L respectively. The first sub-section 67 may have an area S1, and the second sub-section 68 may have an area S2, where S1>S2.

The second extension portion 652 may be connected to a side of the second sub-section 68 away from the side of the first sub-section 67.

The third direction X may intersect the first direction Y, and the third direction X may intersect the second direction Q.

Figure 8:
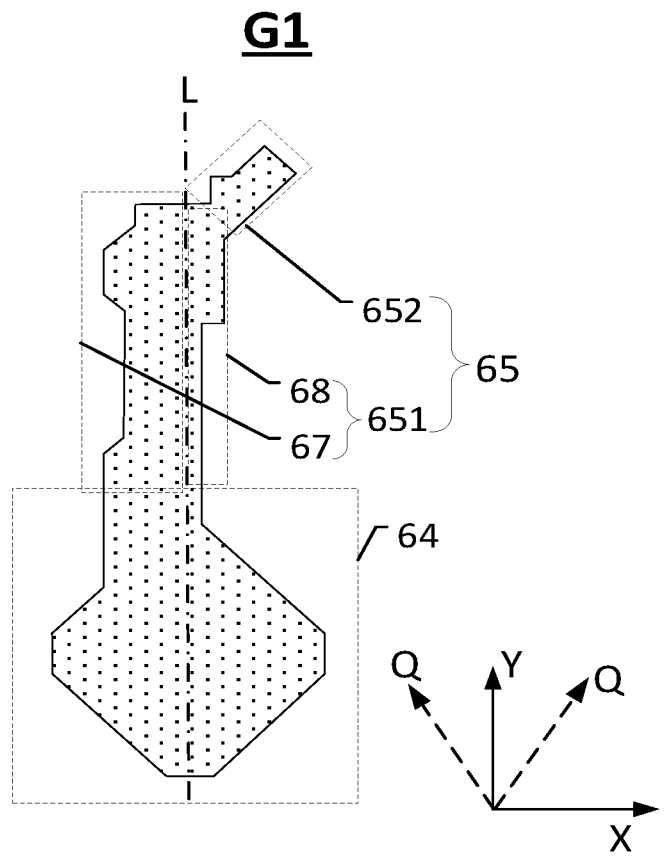
FIG. 8 illustrates a schematic diagram of a second-type anode unit G1 in FIG. 4, consistent with various disclosed embodiments of the present disclosure.

The setting position of the anode unit in the anode layer 61 may be shifted to the left or right in the row direction compared with the original design. For example, as shown in FIG. 4 and FIG. 8, the anode unit may be shifted to the left compared to the original design. Correspondingly, along the thickness direction of the display module 100, the dummy line L extending along the first direction Y may be configured to overlap the center point of the first body portion 64. The first extending portion 651 may include the first sub-section 67 and the second sub-section 68 connected along the third direction X. The first sub-section 67 and the second sub-section 68 may be located on two sides of the dummy line L respectively. The area S1 of the first sub-section 67 may be larger than the area S2 of the second sub-section 68. The second extension portion 652 may be disposed on the side of the second sub-section 68 with a smaller area in the first extension 651, such that parallel plate capacitance and/or lateral capacitance may be formed between the second extension portion 652 and the corresponding second metal component 32. Therefore, the second extension portion may be able to adjust the display uniformity of the display module 100 when the setting position of the anode layer 61 is shifted. In the present embodiment, the second extension portion 652 may be configured to be connected to the side of the second sub-section 68 away from the first sub-section 67, that is, the second extension portion 652 may be configured to be electrically connected to the second sub-section with a smaller area on the side of the dummy line L in the first extension 651, such that the arrangement of the second extension portion 652 may achieve a better effect of compensating the capacitance difference and better improve the display effect of the display module 100.

As shown in FIG. 1 to FIG. 5 and FIG. 8 in one embodiment, the second extension portion 652 may extend toward a side of the second sub-section 68 away from the first sub-section 67.

To further improve the display effect of the display module 100, when the second extension portion 652 is connected to the side of the second sub-section 68 away from the first sub-section 67, in the present embodiment, the extension direction of the second extension portion 652 may be configured to be the side where the second sub-section 68 far away from the first sub-section 67. As shown in FIG. 4 and FIG. 8, the second extension portion 652 corresponding to G1 may be configured to extend toward the side of B1, and the second extension portion 652 corresponding to R2 may be set to extend toward the side of B1, such that the setting of the second extension portion 652 may achieve a better effect of compensating the capacitance difference to better improve the display effect of the display module 100.

As shown in FIG. 1 and FIG. 2, in one embodiment, along the third direction, a distance between the first metal component 31 and a first side edge of the first-type anode unit 611 may be D1, and a distance between the first metal component 31 and a second side edge of the first-type anode unit 611 may be D2, where D1=D2.

The third direction X may intersect the first direction Y, and the third direction X may intersect the second direction Q.

When the setting position of the anode unit in the anode layer 61 is same as the original design, that is, when there is no shift problem, in the display module 100, along the third direction X (that is, the column direction), the distance D1 between the first metal component 31 and the first side edge of the first-type anode unit 611 may be equal to the distance D2 between the first metal component 31 and the second side edge of the first-type anode unit 611. Along the thickness direction of the display module 100, the overlapping part of the first metal component 31 and the first-type anode unit 611 may be disposed at the middle position of the first-type anode unit 611 along the third direction X, such that the overlapping area between the first-type anode unit 611 and the corresponding first metal component 31 in the thickness direction of 100 is just the same as the overlapping area required by the design. When there is a slight shift that is almost imperceptible to the user, it may be still ensured that the overlapping area between the first-type anode unit 611 and the corresponding first metal component 31 along the thickness direction of the display module 100 is the same as the overlapping area required by the design, avoiding the difference between the parallel plate capacitance of the first metal component 31 and the corresponding first-type anode unit 611 from the design requirement. The display effect of the display module 100 may be improved.

As shown in FIG. 1 to FIG. 5 and FIG. 9 illustrating a schematic diagram of the anode layer shifted left in the display module, in one embodiment, along the third direction, a distance between the first metal component 31 and a first side edge of the first-type anode unit 611 may be D1, and a distance between the first metal component 31 and a second side edge of the first-type anode unit 611 may be D2, where D1≠D2.

The third direction X may intersect the first direction Y, and the third direction X may intersect the second direction Q.

When the setting position of the anode unit in the anode layer 61 is shifted left or right compared with the original design, in the display module 100, along the third direction X (that is, the column direction), the distance D1 between the first metal component 31 and the first side edge of the first-type anode unit 611 may be different from the distance D2 between the first metal component 31 and the second side edge of the first-type anode unit 611. As shown in FIG. 4 and FIG. 5, in the present embodiment, the first-type anode unit 611 may be roughly rhombus-shaped, and the side edge of the first-type anode unit 611 facing the first metal component 31 may be configured to be the same straight edge as the row direction. Therefore, when the setting position of the anode unit in the anode layer 61 is shifted left or right compared with the original design, along the thickness direction of the display module 100, the overlapping area between the first-type anode unit 611 and the corresponding first metal component 31 may be still just the same as the overlapping area required by the design, avoiding the difference between the parallel plate capacitance of the first metal component 31 and the corresponding first-type anode unit 611 because of the shift of the first-type anode unit 611. The display effect of the display module 100 may be improved.

Figure 9:
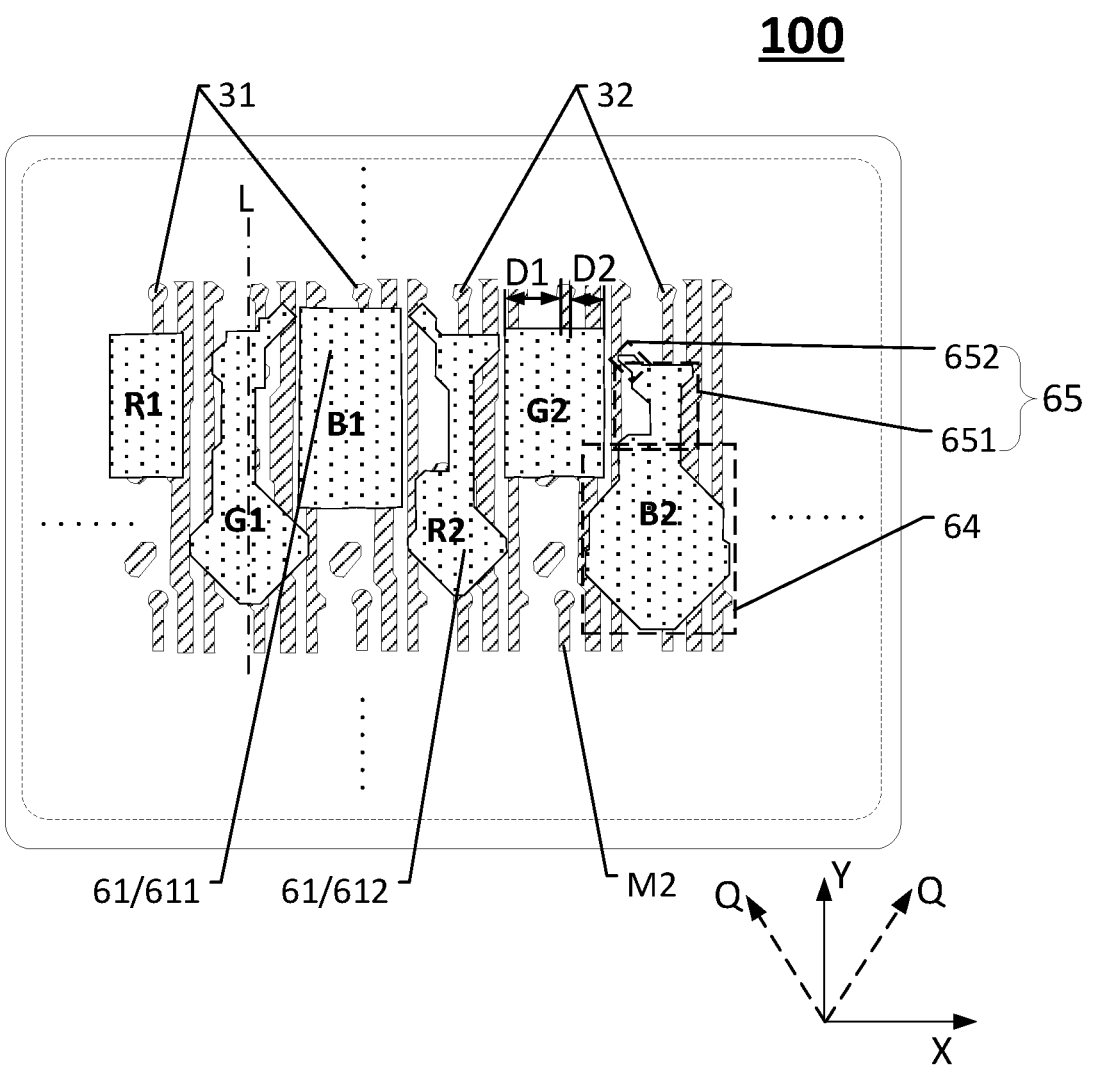
FIG. 9 illustrates another schematic diagram of an anode layer shifted to the left in an exemplary display module consistent with various disclosed embodiments of the present disclosure.

Further, when the distance D1 between the first metal component 31 and the first side edge of the first-type anode unit 611 may be different from the distance D2 between the first metal component 31 and the second side edge of the first-type anode unit 611, as shown in FIG. 9, in another embodiment, the first-type anode unit 611 may be roughly rectangular, and the side edge of the first-type anode unit 611 facing the first metal component 31 may be configured to be the same straight edge as the row direction. Therefore, when the setting position of the anode unit in the anode layer 61 is shifted left or right compared with the original design, along the thickness direction of the display module 100, the overlapping area between the first-type anode unit 611 and the corresponding first metal component 31 may be still just the same as the overlapping area required by the design, avoiding the difference between the parallel plate capacitance of the first metal component 31 and the corresponding first-type anode unit 611 because of the shift of the first-type anode unit 611. The display effect of the display module 100 may be improved.

In the present disclosure, regardless of whether the first-type anode unit 611 is arranged as a roughly rhombus as shown in FIG. 4 or as a rectangle as shown in FIG. 9, the shape of the second-type anode unit 612 is not limited. In various embodiments, the shape of the first body portion 64 in the second type anode unit 612 may be configured to be same as or different from the shape of the first-type anode unit 611, according to different requirements.

Figure 10:
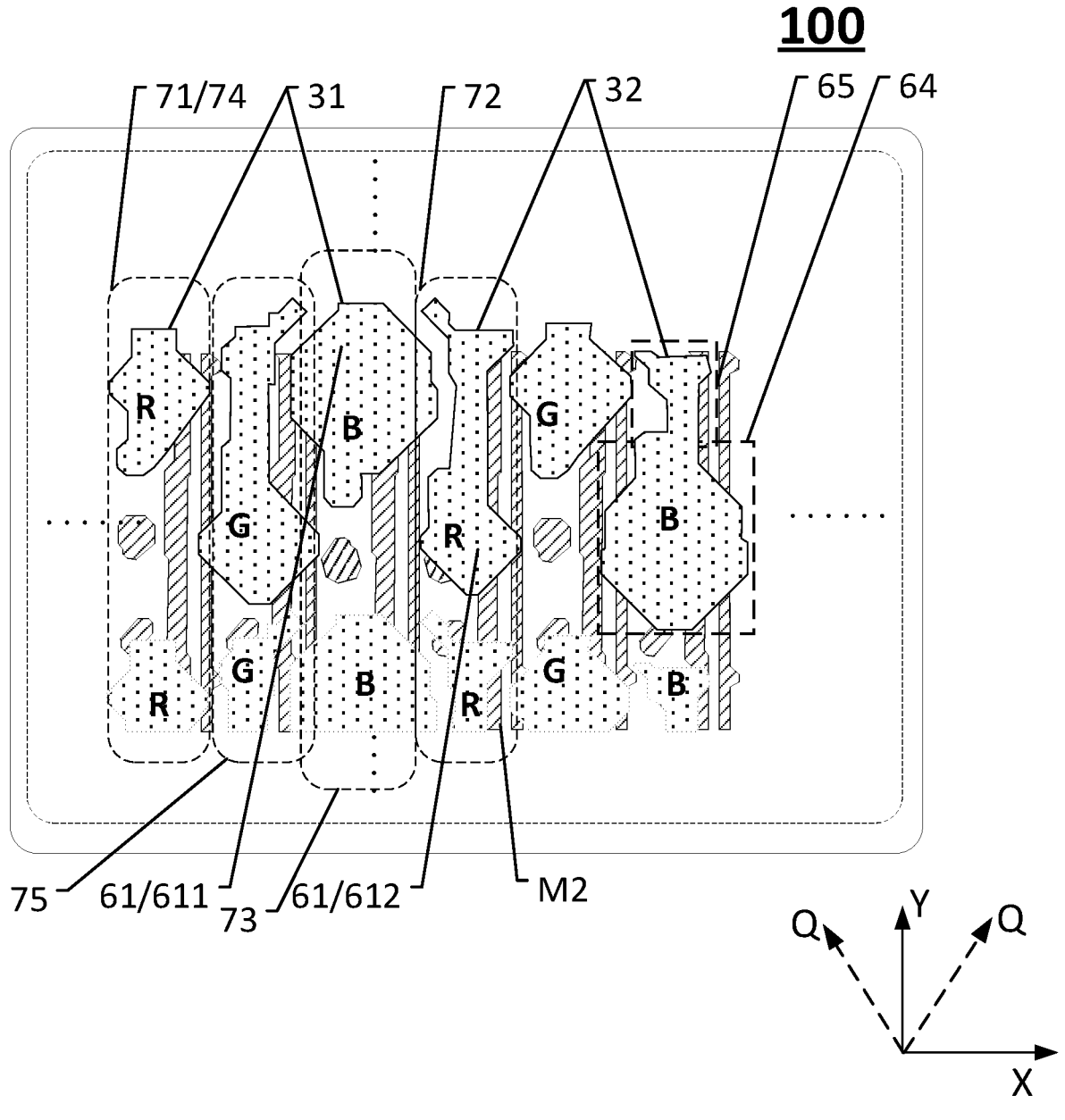
FIG. 10 illustrates another exemplary display module consistent with various disclosed embodiments of the present disclosure.

In previous embodiments shown in FIG. 1, FIG. 4, and FIG. 5, along the thickness direction of the display module 100, the first-type anode unit 611 may partially overlap the first metal component 31, and the second-type anode unit 612 may partially overlap the second metal component 32. In some other embodiments shown in FIG. 10 illustrating another exemplary display module 100, the first metal component 31 may be disposed inside the orthographic projection of the first-type anode unit 611, and the second metal component 32 may be disposed inside the orthographic projection of the second-type anode unit 612. The above embodiments with the two described position relationships between the metal components and the corresponding anode units are used as examples only to illustrate the present disclosure, and do not limit the scope of the present disclosure. In various embodiments, the position relationships between the metal components and the corresponding anode units may be adjusted according to the actual design requirements of the panel structure of the display module 100.

In one embodiment shown in FIG. 1 to FIG. 5, the first-type anode unit 611 may at least include a second body portion 611'. In FIG. 1 to FIG. 5, the second body portion 611' is stilled labeled as 611.

The first-type anode unit 611 may at least include a body portion. The body portion of the first-type anode unit 611 may be named as the second body portion 611', for distinguishing from the first body portion 64 of the second-type anode unit 512. In one embodiment as shown in FIG. 1, FIG. 4, and FIG. 5, the first-type anode unit 611 may only include a second body portion 611'. The side edge of the second body portion 611' of the first-type anode unit 611 facing the first metal component 31 in the column direction may be configured to be a straight-line edge extending along the row direction. Therefore, when the setting position of the anode unit in the anode layer 61 is shifted left or right compared with the original design, along the thickness direction of the display module 100, the overlapping area between the second body portion 611' of the first-type anode unit 611 and the corresponding first metal component 31 may not change, avoiding the change of the parallel plate capacitance of the first metal component 31 and the corresponding first-type anode unit 611 because of the shift of the first-type anode unit 611. The even display of the display module 100 may be improved.

In another embodiment shown in FIG. 1 to FIG. 5 and FIG. 11, the first-type anode unit 611 may further include a third extension portion 69. The third extension portion 69 may be connected to the second body portion 611'. An extension direction of the third extension portion 69 may intersect the extension direction of the first extension portion 651.

Figure 11:
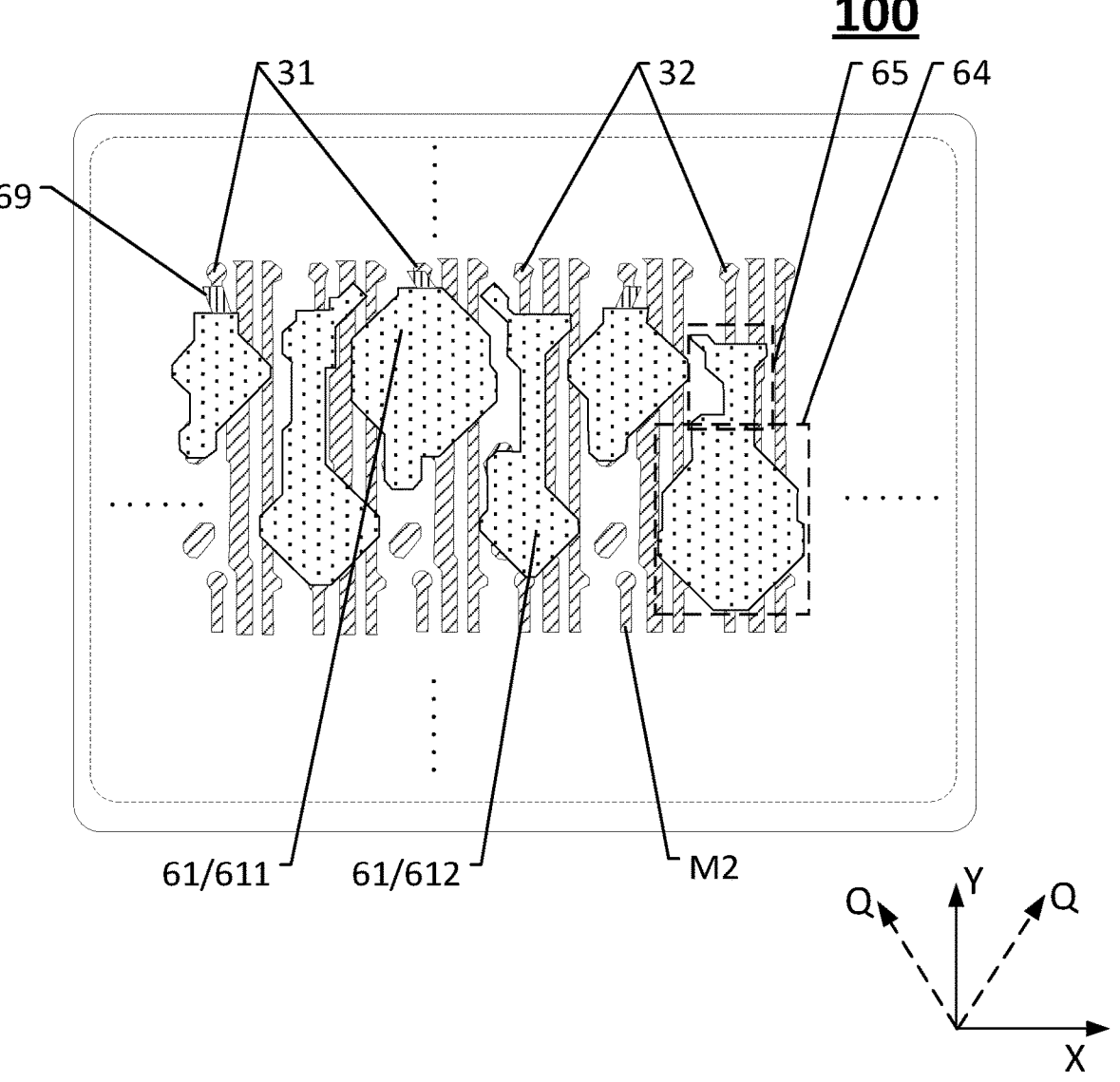
FIG. 11 illustrates another exemplary display module consistent with various disclosed embodiments of the present disclosure.
Figure 12:
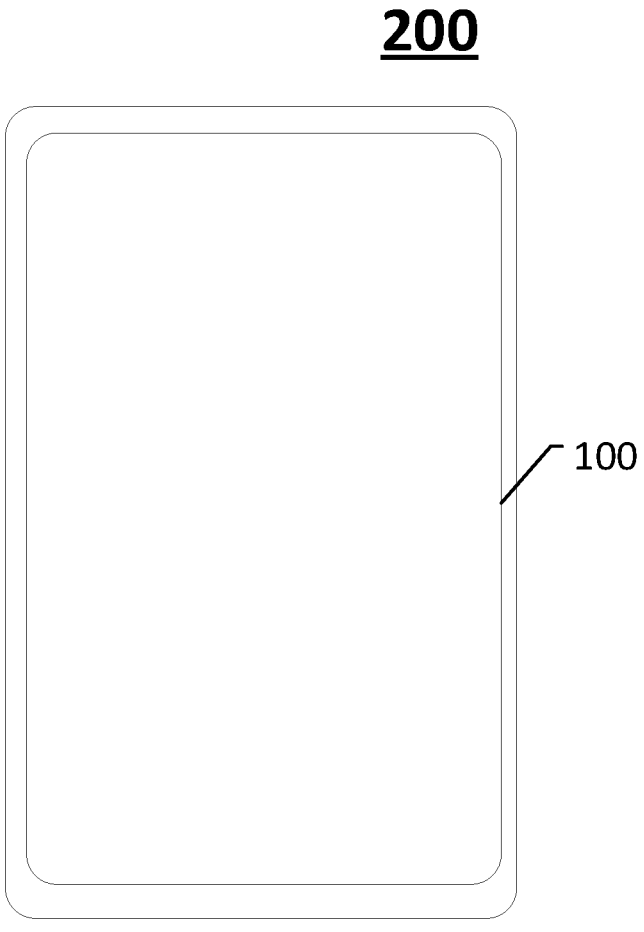
FIG. 12 illustrates an exemplary display device consistent with various disclosed embodiments of the present disclosure.

In the present embodiment, the first-type anode unit 611 may further include the third extension portion 69 connected to the second body portion 611'. As shown in FIG. 11, the extension direction of the third extension portion 69 may be substantially same as, for example, the extension direction of any one second extension portion 652. Therefore, when the first-type anode unit 611 deviates significantly to the left or right from the original design position, the parallel plate capacitance and/or the lateral capacitance between the third extension portion 69 and the first metal component 31 may be used to maintain the capacitance between the first-type anode unit 611 and the corresponding first metal component 31, avoiding the uneven display of the display module 100 corresponding to the first-type anode unit 611 because of capacitance difference. The display uniformity of the display module 100 may be improved.

The present disclosure does not specifically limit the number, size, and shape of the third extension portion 69 and the second extension portion 652, which may be adjusted according to design requirements to achieve the desired technical effect.

In one embodiment, as shown in FIG. 1, FIG. 2, and FIG. 10, a plurality of first-type anode units 611 may be arranged along the first direction Y to form first-type anode unit groups 71, and a plurality of second-type anode units 612 may be arranged along the first direction Y to form second-type anode unit groups 72. The first-type anode unit groups 71 and the second-type anode unit groups 72 may be arranged alternately along the third direction X.

Along the third direction X, among the adjacently arranged first type anode unit groups 71 and the second type anode unit groups 72, the first-type anode unit 611 and the corresponding first body portion 64 may not overlap.

The first direction Y and the third direction X may intersect.

In the existing technologies, the light emitting devices 60 may be arranged in a diamond arrangement. The body portions of the first-type anode units 611 corresponding to the red sub-pixels R, and/or the blue sub-pixels B, and/or the green sub-pixels G in odd columns may be arranged in a same row. The first body portions 64 of the second-type anode units 612 corresponding to the red sub-pixels R, and/or the blue sub-pixels B, and/or the green sub-pixels G of the even-numbered columns may be arranged in another row. That is to say, the first body portions 64 in the second-type anode units 612 corresponding to the even-numbered columns and the first-type anode units 611 corresponding to the odd-numbered columns may be located in different rows.

Correspondingly, the plurality of first-type anode units 611 may be arranged along the first direction Y to form the first-type anode unit groups 71, and the plurality of second-type anode units 612 may be arranged along the first direction Y to form the second-type anode unit groups 72. The first-type anode unit groups 71 and the second-type anode unit groups 72 may be arranged alternately along the third direction X. Along the third direction X, among the adjacently arranged first type anode unit groups 71 and the second type anode unit groups 72, the first-type anode unit 611 and the corresponding first body portion 64 may not overlap. The present embodiment where one second-type anode unit 612 includes the first extension portion 651 and the second extension portion and the first-type anode unit 611 includes the third extension portion 69 corresponding to the diamond arrangement of the light-emitting devices 60 is used as an example to illustrate the present disclosure only, and does not limit the scope of the present disclosure. In some other embodiments, at least one of the first extension portion 651, the second extension portion 652, and the third extension portion 69 may be applied to the light-emitting devices 60 arranged in other manners.

As shown in FIG. 1, FIG. 2, and FIG. 10, in one embodiment, along the third direction X, the display module 100 may include a plurality of sub-pixel columns arranged in sequence, and the plurality of sub-pixel columns may at least include a first color sub-pixel column 74, a second color sub-pixel column 75, and a third color sub-pixel column 73 arranged alternately.

Along the thickness direction of the display module 100, at least a portion of plurality of sub-pixel columns may be disposed corresponding to a column of first-type anode unit groups 71, and at least a portion of plurality of sub-pixel columns may be disposed corresponding to a column of second-type anode unit groups 71.

In the present embodiment, as shown in FIG. 10, along the third direction X, the display module 100 may include the first color sub-pixel column 74, the second color sub-pixel column 75, and the third color sub-pixel column 73 arranged in sequence. The first-type anode units 611 may be disposed in the anode layer 61 corresponding to one sub-pixel column of the odd-numbered columns, and the second-type anode units 612 may be disposed in the anode layer 61 corresponding to one sub-pixel column of the even-numbered columns. The present embodiment is used as an example to illustrate the present disclosure only, and does not limit the scope of the present disclosure. In some other embodiments, the arrangement of the display module 100 may be adjusted according to actual design requirements.

As shown in FIG. 1 to FIG. 5, in one embodiment, the source-drain metal layer M2 may include a plurality of source-drain metal units 80 arranged in an array. The first metal component 31 may be located in one source-drain metal unit 80 in odd columns, and the second metal component 32 may be located in one source-drain metal units 80 in even columns.

The first metal component 31 may be one of the source 23/24 or drain 24/23 not electrically connected to the anode layer 61 in the source-drain metal unit 80 of odd columns, and the second metal component 32 may be one of the source 23/24 or the drain 24/23 of the source-drain metal units 80 in even columns not electrically connected to the anode layer 61.

In the present embodiment, the first metal component 31 and the second metal component 32 may both be one of the sources 23/24 or drain 24/23 that is not electrically connected to the anode layer 61 in the corresponding transistors 20 electrically connected to the anode layer 61 respectively. The capacitance (the parallel plate capacitance or the lateral capacitance) between the first metal component 31 that is not is not electrically connected to the anode layer 61 and the corresponding first-type anode unit 611 may be configured to be same as the capacitance (the parallel plate capacitance or the lateral capacitance) between the second metal component 32 that is not is not electrically connected to the anode layer 61 and the corresponding second-type anode unit 612, avoiding the uneven display of the display module 100 corresponding to the first-type anode unit 611 because of capacitance difference. The display uniformity of the display module 100 may be improved.

In the present disclosure, by adding the small ear structure of the second extension portion 652 in the second-type anode unit 612, the parallel plate capacitance and the lateral capacitance between the RE (anode units) and the corresponding first metal component 31 and the second metal component 32 respectively when the RE (anode units) are shifted or not shifted may be balanced, to make the capacitance of odd and even column pixels RE (N4) and N1 still close to each other when the RE (anode units) are shifted or not shifted. Therefore, the problem of poor display caused by the difference in capacitance may be avoided, ensuring the display uniformity of the display module 100.

The present disclosure also provides a display device. As shown in FIG. 1 to FIG. 11, and FIG. 12 illustrating an exemplary display device 200, in one embodiment, the display device 200 may include a display module 100 provided by various embodiments of the present disclosure.

The details of the display device 200 may be made reference to the previous embodiments of the display module 100. The display device 200 may be products or components such as a cell phone, a tablet computer, a television, a laptop computer, or a navigator.

In the present disclosure, the second-type anode unit corresponding to the second metal component in the source-drain metal layer in the display module may include the first body portion and the first sub-extension unit connected to each other. Along the thickness direction of the display module, the second metal portion may at least partially overlap the first sub-extension unit and may not overlap the first body portion. The first metal portion and the first-type anode unit in the source-drain metal layer of the display module, may at least partially overlap along the thickness direction of the display module. The first-type of anode unit and the second-type anode unit may be respectively arranged in odd-numbered columns and even-numbered columns. Correspondingly, the added first sub-extension unit may enable the first metal component and the second metal component in different columns to have almost the same overlapping area with the anode layers in the correspondingly arranged light-emitting devices, avoiding the capacitance difference between the light-emitting layers arranged in different columns and the array circuits and improving the display uniformity of the display device.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A display module, comprising array layers and light-emitting devices, wherein:

one light-emitting device is located on a side of one corresponding array layer facing a light-emitting surface of the display module;

one array layer includes a source-drain metal layer, and the source-drain metal layer includes a first metal component and a second metal component;

the light-emitting device includes an anode layer, and the anode layer includes a first-type anode unit and a second-type anode unit;

the first-type anode unit is disposed correspondingly to the first metal component, and the second-type anode unit is disposed correspondingly to the second metal component;

the second-type anode unit includes a first body portion and a first sub-extension unit connected to each other; and along a thickness direction of the display module, the first metal component at least partially overlaps the first-type anode unit, and the second metal component at least partially overlaps the first sub-extension unit while does not overlap the first body portion.

2. The display module according to claim 1, wherein: the first sub-extension unit includes a first extension portion and a second extension portion connected to each other, and the second extension portion is located at a side of the first extension portion away from the first body portion.

3. The display module according to claim 2, wherein: the first extension portion and the first body portion are disposed in a same layer; and the second extension portion and the first extension portion are disposed in a same layer or different layers.

4. The display module according to claim 2, wherein: along the thickness direction of the display module, at least a part of second metal portions at least partially overlaps corresponding first extension portions; and the second metal portions do not overlap corresponding second extension portions, and do not overlap corresponding first body portions.

5. The display module according to claim 2, wherein: along the thickness direction of the display module, at least a part of second metal portions at least partially overlaps corresponding first extension portions, and at least partially overlap corresponding second extension portions; and the second metal portions do not overlap corresponding first body portions.

6. The display module according to claim 2, wherein: the first extension portion extends along a first direction, and the second extension portion extends along a second direction, wherein the first direction intersects with the second direction.

7. The display module according to claim 6, wherein: along the thickness direction of the display module, a dummy line extending along the first direction overlaps a central point of the first body portion; the first extension portion includes first subsection and a second subsection connected to each other along a third direction; the first subsection and the second subsection are arranged on two sides of the dummy line respectively; an area of the first subsection is S1, and an area of the second subsection is S2, wherein S1>S2; the second extension portion is connected to a side of the second subsection away from the first subsection; and the third direction intersects the first direction and the second direction.

8. The display module according to claim 7, wherein: the second extension portion extends toward the side of the second subsection away from the first subsection.

9. The display module according to claim 6, wherein: along the third direction, a distance between the first metal component and a first side of the first-type anode unit is D1, and a distance between the first metal component and a second side of the first-type anode unit is D2, wherein D1=D2; and the third direction intersects the first direction and the second direction.

10. The display module according to claim 6, wherein: along the third direction, a distance between the first metal component and a first side of the first-type anode unit is D1, and a distance between the first metal component and a second side of the first-type anode unit is D2, wherein D1≠D2; and the third direction intersects the first direction and the second direction.

11. The display module according to claim 2, wherein: the first-type anode unit at least includes a second body portion.

12. The display module according to claim 11, wherein: the first-type anode unit further includes a third extension portion connected to the second body portion; and an extension direction of the third extension portion intersects the extension direction of the first extension portion.

13. The display module according to claim 1, wherein: a plurality of first-type anode units are arranged along a first direction to form first-type anode unit groups, and a plurality of second-type anode units are arranged along the first direction to form second-type anode unit groups;

the first-type anode unit groups and the second-type anode unit groups are arranged alternately along a third direction;

along the third direction, in one first-type anode unit group and one second-type anode unit group adjacently arranged, the first-type anode unit and the first body portion do not overlap; and the first direction and the third direction intersect.

14. The display module according to claim 13, wherein:

along the third direction, the display module includes a plurality of sub-pixel columns arranged in sequence;

the plurality of sub-pixel columns at least include a first color sub-pixel column, a second color sub-pixel column, and a third color sub-pixel column; and along the thickness direction of the display module, at least a portion of the plurality of sub-pixel columns are arranged corresponding to a column of the first-type anode unit groups, and at least a portion of the plurality of sub-pixel columns are arranged corresponding to a column of the second-type anode unit groups.

15. The display module according to claim 1, wherein:

the source-drain metal layer includes a plurality of source-drain metal units arranged in an array;

the first metal component is located in one source-drain metal unit of odd columns, and the second metal component is located in one source-drain metal unit of even columns; and the first metal component is one of a source or a drain that is not electrically connected to the anode layer in the corresponding source-drain metal unit of odd columns, and the second metal component is one of a source or a drain that is not electrically connected to the anode layer in the corresponding source-drain metal unit of even columns.

16. A display device comprising a display module, wherein:

the display module includes array layers and light-emitting devices;

one light-emitting device is located on a side of one corresponding array layer facing a light-emitting surface of the display module;

one array layer includes a source-drain metal layer, and the source-drain metal layer includes a first metal component and a second metal component;

the light-emitting device includes an anode layer, and the anode layer includes a first-type anode unit and a second-type anode unit;

the first-type anode unit is disposed correspondingly to the first metal component, and the second-type anode unit is disposed correspondingly to the second metal component;

the second-type anode unit includes a first body portion and a first sub-extension unit connected to each other; and along a thickness direction of the display module, the first metal component at least partially overlaps the first-type anode unit, and the second metal component at least partially overlaps the first sub-extension unit while does not overlap the first body portion.

* * * * *